United States Patent
Tsukamoto et al.

(10) Patent No.: US 8,971,090 B2
(45) Date of Patent: Mar. 3, 2015

(54) SEMICONDUCTOR MEMORY DEVICE

(71) Applicant: Kabushiki Kaisha Toshiba, Tokyo (JP)

(72) Inventors: Takayuki Tsukamoto, Yokkaichi (JP);
Jun Nishimura, Kuwana (JP);
Masahiro Une, Hiroshima (JP);
Takafumi Shimotori, Kawasaki (JP);
Yoichi Minemura, Yokkaichi (JP);
Hiroshi Kanno, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 69 days.

(21) Appl. No.: 13/773,989

(22) Filed: Feb. 22, 2013

(65) Prior Publication Data

US 2014/0063908 A1 Mar. 6, 2014

Related U.S. Application Data

(60) Provisional application No. 61/695,799, filed on Aug. 31, 2012.

(51) Int. Cl.
*G11C 13/00* (2006.01)

(52) U.S. Cl.
CPC ........ *G11C 13/0069* (2013.01); *G11C 13/0002* (2013.01); *G11C 13/0061* (2013.01); *G11C 2013/0088* (2013.01)
USPC .......................................... 365/148; 365/226

(58) Field of Classification Search
CPC ....... G11C 13/00; G11C 13/0069; G11C 5/14
USPC .......................................... 365/148, 163, 226
See application file for complete search history.

(56) References Cited

U.S. PATENT DOCUMENTS

| 7,668,001 | B2 | 2/2010 | Tajiri et al. | |
|---|---|---|---|---|
| 8,045,362 | B2 | 10/2011 | Maejima | |
| 8,085,576 | B2 | 12/2011 | Hosono et al. | |
| 8,270,203 | B2 | 9/2012 | Maejima | |
| 2008/0192524 | A1* | 8/2008 | Fasoli et al. | 365/51 |
| 2009/0027950 | A1* | 1/2009 | Lam et al. | 365/163 |
| 2009/0135641 | A1 | 5/2009 | Tajiri et al. | |
| 2010/0027317 | A1 | 2/2010 | Maejima | |
| 2010/0214820 | A1* | 8/2010 | Hosono et al. | 365/148 |

(Continued)

FOREIGN PATENT DOCUMENTS

| JP | 2007-26627 | 2/2007 |
|---|---|---|
| JP | 2010-33676 | 2/2010 |

(Continued)

*Primary Examiner* — Michael Tran
(74) *Attorney, Agent, or Firm* — Oblon, Spivak, McClelland, Maier & Neustadt, L.L.P.

(57) ABSTRACT

A semiconductor memory device according to an embodiment comprises: a memory cell array including memory cells, each of the memory cells disposed at each of intersections of first lines and second lines and including a variable resistor; and a control circuit configured to apply a first voltage to a selected first line and to apply a second voltage having a voltage value which is smaller than that of the first voltage to a selected second line, such that a selected memory cell is applied with a first potential difference required in an operation of the selected memory cell. The control circuit is configured such that when the first potential difference is applied a plurality of times to a plurality of the selected memory cells to execute the operation, the number of selected memory cells simultaneously applied with the first potential difference can be changed.

20 Claims, 17 Drawing Sheets

(56) References Cited

U.S. PATENT DOCUMENTS

| | | | |
|---|---|---|---|
| 2010/0271862 A1* | 10/2010 | Yoon et al. | 365/148 |
| 2011/0066878 A1 | 3/2011 | Hosono et al. | |
| 2011/0235401 A1* | 9/2011 | Kunitake et al. | 365/148 |
| 2011/0299319 A1* | 12/2011 | Kono | 365/148 |
| 2011/0299320 A1* | 12/2011 | Kono | 365/148 |
| 2012/0002476 A1* | 1/2012 | Yan et al. | 365/185.11 |
| 2012/0014167 A1 | 1/2012 | Maejima | |
| 2012/0182784 A1* | 7/2012 | Murooka | 365/148 |
| 2012/0230083 A1 | 9/2012 | Maejima | |

FOREIGN PATENT DOCUMENTS

| | | |
|---|---|---|
| JP | 2010-198687 | 9/2010 |
| JP | 2011-86365 | 4/2011 |

\* cited by examiner

SEMICONDUCTOR MEMORY DEVICE

CROSS REFERENCE TO RELATED APPLICATION

This application is based upon and claims the benefit of priority from Provisional Application No. 61/695,799, filed on Aug. 31, 2012, the entire contents of which are incorporated herein by reference.

BACKGROUND

1. Field

Embodiments described herein relate to a semiconductor memory device.

2. Description of the Related Art

In recent years, a resistance change memory device employing a variable resistor as a storage element has been receiving attention as a successor candidate of flash memory. The resistance change memory device herein is assumed to include not only narrowly-defined resistance change memory (ReRAM: Resistive RAM) in which a transition metal oxide is adopted as a recording layer and a resistance value state of the recording layer is stored in a nonvolatile manner, but also the likes of phase change memory (PCRAM: Phase Change RAM) in which chalcogenide and so on is employed as a recording layer and resistance value information of a crystalline state (conductor) and an amorphous state (insulator) of the recording layer is utilized.

A memory cell array in the resistance change memory device has memory cells disposed at intersections of bit lines and word lines, each memory cell configured from a variable resistor and a current rectifier element such as a diode. In such a memory cell array, selection of a memory cell can be performed utilizing the current rectifier element such as a diode. In addition, a high density memory cell array can also be realized by alternately stacking bit lines and word lines to configure the memory cell array in a three-dimensional stacking arrangement.

In the memory cell array having memory cells disposed at intersections of bit lines and word lines, when an operation is executed on a plurality of selected memory cells, characteristics during a voltage application operation on the memory cells may deteriorate as the number of selected memory cells increases. In that case, there is a possibility that an accurate operation cannot be executed on the plurality of selected memory cells.

DETAILED DESCRIPTION

Figure 1:
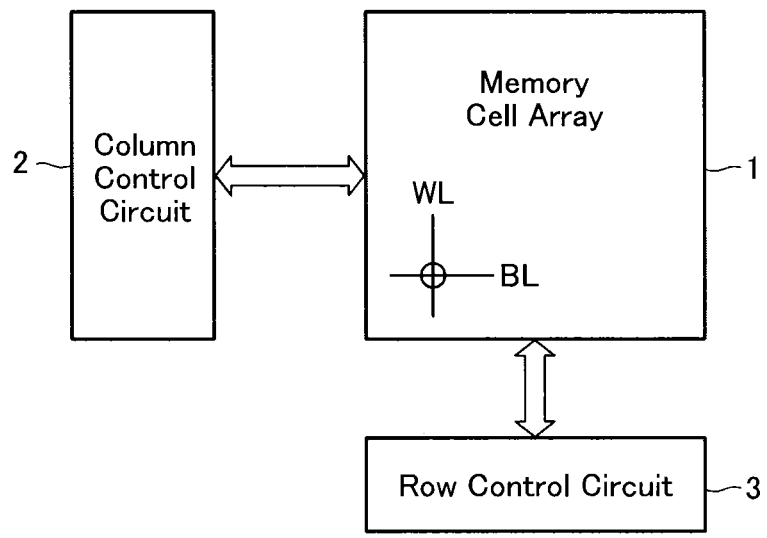
FIG. 1 is a block diagram of a semiconductor memory device according to a first embodiment of the present invention.

A semiconductor memory device according to an embodiment comprises: a plurality of first lines disposed on a substrate; a plurality of second lines disposed intersecting the first lines; a memory cell array including memory cells, each of the memory cells disposed at each of intersections of the first lines and the second lines and including a variable resistor; and a control circuit configured to apply a first voltage to a selected first line and to apply a second voltage having a voltage value which is smaller than that of the first voltage to a selected second line, such that a selected memory cell disposed at the intersection of the selected first line and the selected second line is applied with a first potential difference required in an operation of the selected memory cell. The control circuit is configured such that when the first potential difference is applied a plurality of times to a plurality of the selected memory cells to execute the operation, the number of selected memory cells simultaneously applied with the first potential difference can be changed.

Next, embodiments of the present invention are described in detail with reference to the drawings. Note that in descriptions of the drawings in the embodiments below, places of identical configuration are provided with identical reference numerals and duplicated descriptions are omitted.

[Overall Configuration]

FIG. 1 is a block diagram showing a configuration of a nonvolatile memory according to a first embodiment of the present invention. This nonvolatile memory comprises a memory cell array 1 having memory cells disposed in a matrix therein, each of the memory cells using a variable resistor VR to be described later.

In order to control the bit lines BL of the memory cell array 1 to perform data erase of the memory cells, data write to the memory cells, and data read from the memory cells, a column control circuit 2 that controls a voltage of the bit lines BL is electrically connected to bit lines BL of the memory cell array 1. Moreover, in order to select the word lines WL of the memory cell array 1 to perform data erase of the memory cells, data write to the memory cells, and data read from the memory cells, a row control circuit 3 that controls a voltage of the word lines WL is electrically connected to word lines WL of the memory cell array 1.

[Memory Cell Array 1]

Figure 2:
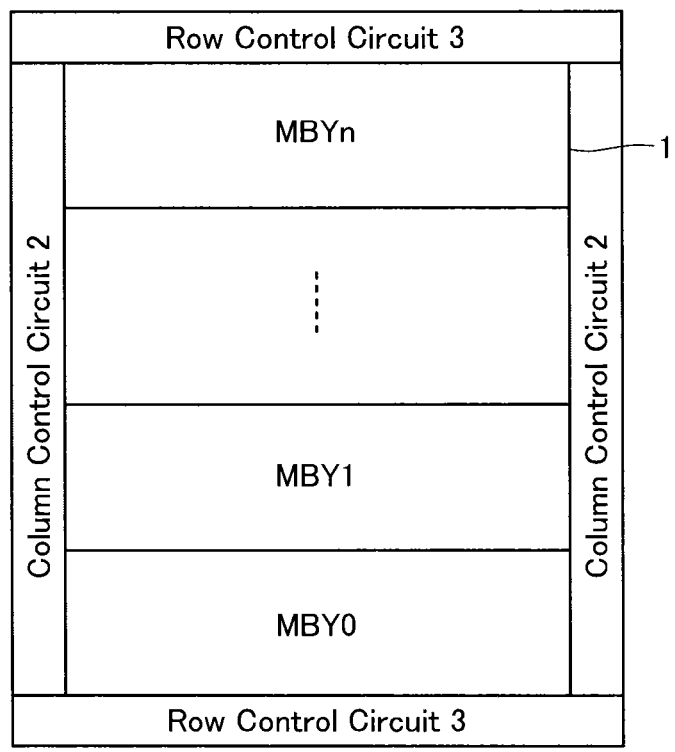
FIG. 2 is a block diagram of the semiconductor memory device according to the first embodiment of the present invention.

FIG. 2 is an enlarged view of the memory cell array 1. The memory cell array 1 is divided into a plurality of memory bays MBY0~MBYn. Disposed in a periphery of these plurality of memory bays MBY0~MBYn are the column control circuit 2 and the row control circuit 3 for controlling an operation of each of the memory bays MBY0~MBYn. The column control circuit 2 is configured such that the operation can be executed changing the number of memory bays MBY selected from the plurality of memory bays MBY0~MBYn.

Figure 3:
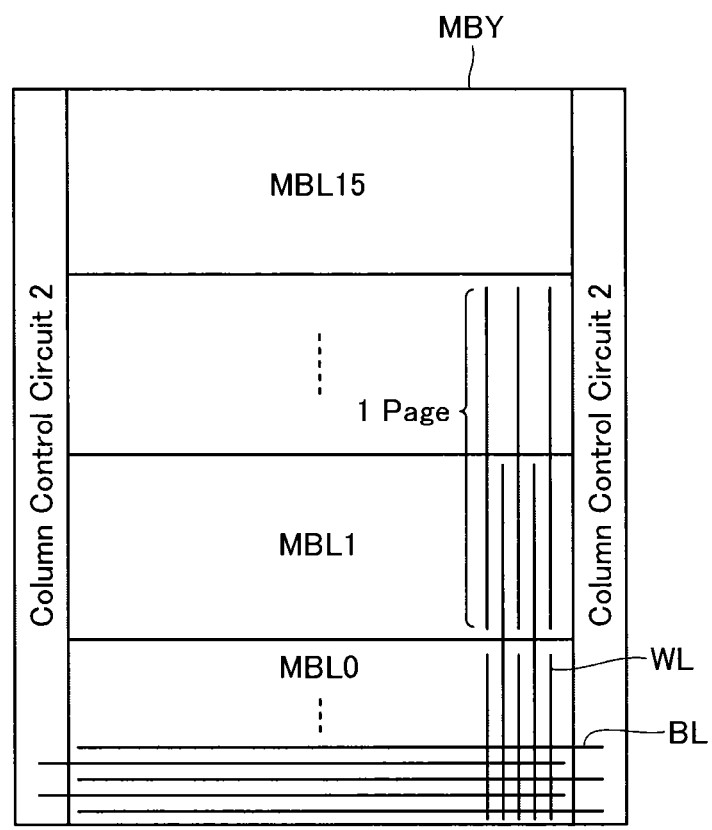
FIG. 3 is a block diagram of the semiconductor memory device according to the first embodiment of the present invention.

FIG. 3 is an enlarged view of the memory bay MBY. The memory bay MBY is divided into a plurality of memory blocks MBL0~MBL15.

The bit lines BL and the word lines WL are disposed intersecting, on the inside of each of the memory blocks MBL0~MBL15. The plurality of bit lines BL provided in one of the memory blocks MBL0 are alternately connected to two of the column control circuits provided at both sides of the memory block MBL0. Moreover, a portion of the word lines WL are shared by two of the memory blocks MBL (for example, memory blocks MBL0 and MBL1). Note that a configuration of the bit lines BL and the word lines WL is not limited to that in the above description, and the bit lines BL and the word lines WL need only be provided intersecting in each of the memory blocks MBL.

Figure 4:
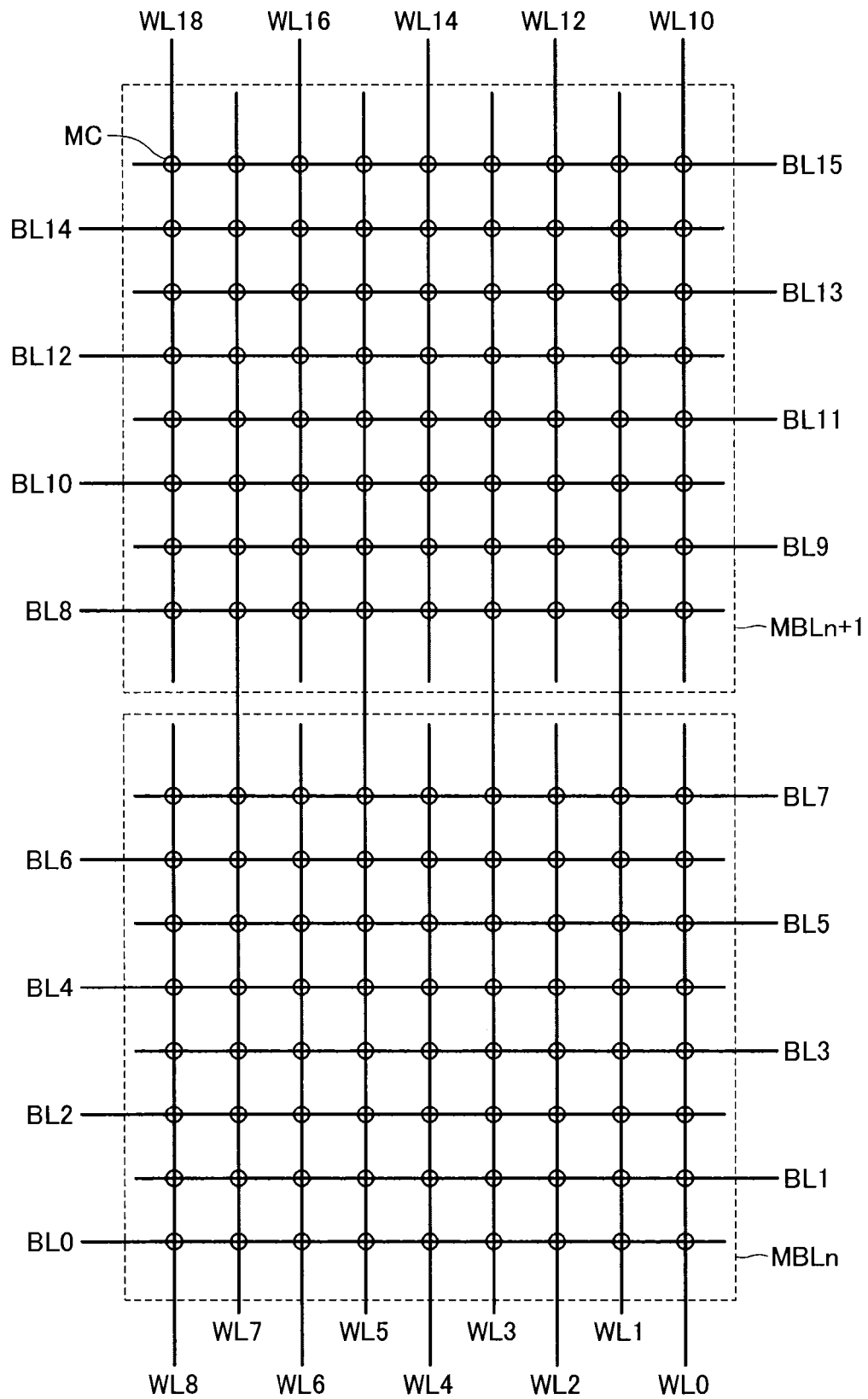
FIG. 4 is an enlarged view of part of a memory cell array according to the first embodiment of the present invention.

FIG. 4 is an enlarged view of the memory block MBL. As described above, the bit lines BL and the word lines WL are disposed intersecting, on the inside of two adjacent memory blocks MBLn and MBLn+1. Memory cells MC are disposed at each of intersections of the bit lines BL and the word lines WL. A portion of the word lines WL (WL1, WL3, WL5, and WL7) are shared by two adjacent memory blocks MBLn and MBLn+1. These word lines WL1, WL3, WL5, and WL7 are selected and driven by the row control circuit 3, via word line drivers (not illustrated) provided between the memory blocks MBLn and MBLn+1, for example. The operation can be executed assuming the word lines WL1, WL3, WL5, and WL7 sharing these word line drivers to be one page.

Figure 5:
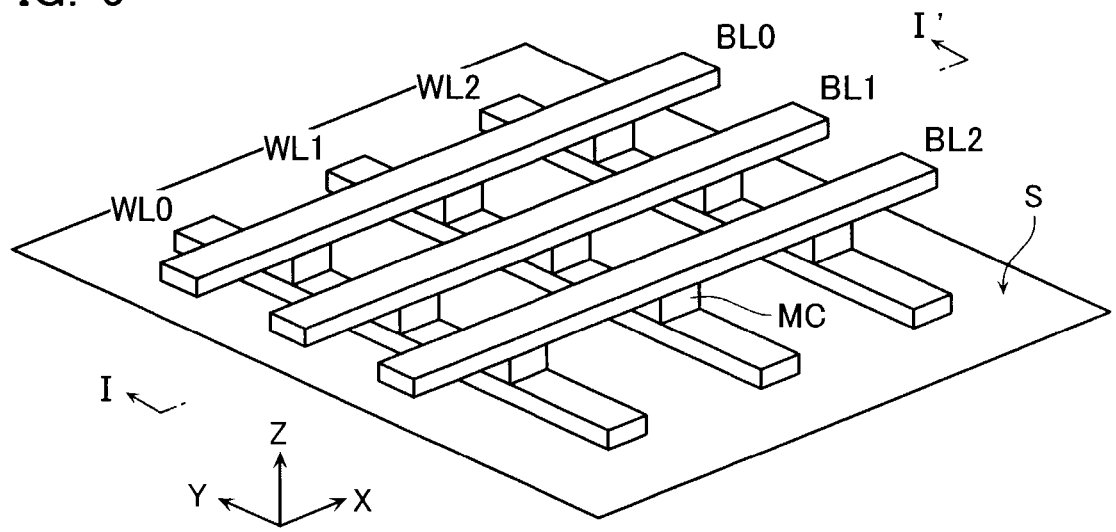
FIG. 5 is a perspective view of part of a memory cell array 1.
Figure 6:
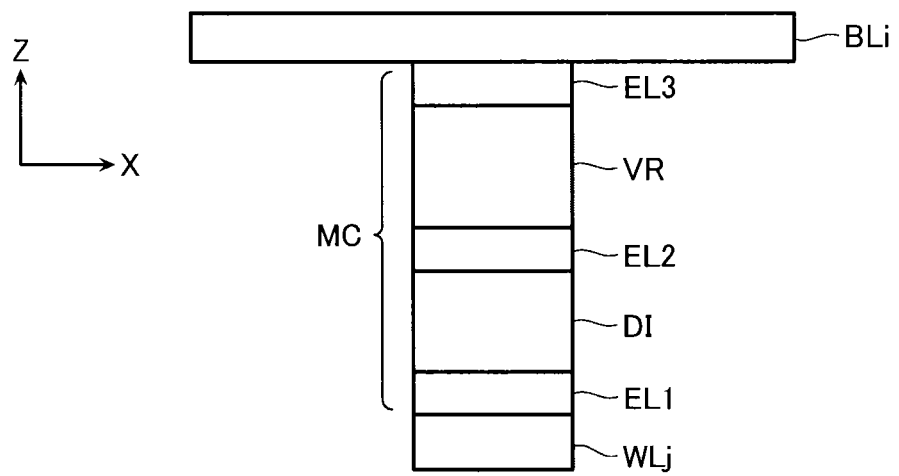
FIG. 6 is a cross-sectional view taken along the line I-I' as seen in the direction of the arrows in FIG. 5, showing a single memory cell portion.

FIG. 5 is a perspective view of part of the memory cell array 1, and FIG. 6 is a cross-sectional view taken along the line I-I' as seen in the direction of the arrows in FIG. 5, showing a single memory cell portion. The bit lines BL0~BL2 acting as a plurality of first lines are disposed in an X direction parallel to a surface of a semiconductor substrate S, and the word lines WL0~WL2 acting as a plurality of second lines are disposed in a Y direction parallel to the surface of the semiconductor substrate S so as to intersect these bit lines BL0~BL2. The memory cells MC are disposed at each of intersections of the word lines WL0~WL2 and the bit lines BL0~BL2 so as to be sandwiched between both lines. The first and second lines are desirably of a material that is heat resistant and has a low resistance value. For example, W, WN, WSi, NiSi, CoSi, and so on, may be employed as the material of the first and second lines.

[Memory Cell MC]

As shown in FIG. 6, the memory cell MC is a circuit having the variable resistor VR and a current rectifier element such as a diode DI, for example, connected in series in a Z direction perpendicular to the semiconductor substrate S. Disposed above and below the variable resistor VR and the diode DI are electrodes EL1, EL2, and EL3 functioning as a barrier metal and an adhesive layer. Disposed on the electrode EL1 is the diode DI, and disposed on the diode DI is the electrode EL2. Disposed on the electrode EL2 is the variable resistor VR, and disposed on the variable resistor VR is the electrode EL3. Employable as an electrode material of the electrodes EL1, EL2, and EL3 is for example titanium nitride (TiN). In addition, it is also possible for a different material to be adopted for each of the electrodes EL1, EL2, and EL3. The following may also be employed as a material of the electrodes, namely, for example, Pt, Au, Ag, TiAlN, SrRuO, Ru, RuN, Ir, Co, Ti, TaN, LaNiO, Al, PtIrO$_x$, PtRhO$_x$, Rh, TaAlN, W, WN, TaSiN, TaSi$_2$, TiSi, TiC, TaC, Nb—TiO$_2$, NiSi, CoSi, and so on. Moreover, a metal film may be inserted to make orientation uniform. In addition, inserting a buffer layer, barrier metal layer, adhesive layer, and so on, is also possible. Furthermore, a structure modifying an order of Z direction stacking of the diode DI and the variable resistance layer VR is also included in embodiments of the present invention.

[Variable Resistor]

Employed as the variable resistor VR is a substance capable of having its resistance value changed via an electric field, a current, heat, chemical energy, and so on, by a voltage application. The variable resistor VR may employ the likes of the following, namely: a substance having its resistance value changed by a phase change between a crystalline state and an amorphous state in the manner of chalcogenide and so on (PCRAM); a substance having its resistance value changed by depositing metal cations to form a bridge (contacting bridge) between electrodes and ionizing the deposited metal to destroy the bridge (CBRAM); and a substance that changes its resistance value by voltage or current application (broadly classified into a substance where resistance change occurs due to presence/absence of a charge trapped in a charge trap existing in an electrode interface, and a substance where resistance change occurs due to presence/absence of a conductive path induced by oxygen defect or the like) (ReRAM).

[Current Rectifier Element]

The current rectifier element employed in the memory cell MC is not limited particularly, in terms of material, structure, and so on, provided it is an element having a current rectifying characteristics in its voltage/current characteristics. One example of a current rectifier element is a diode DI configured by polysilicon (Poly-Si). Employable as an example of the diode DI is a PIN diode having a p type layer and an n type layer that include an impurity, and an i layer inserted between these p type layer and n type layer that does not include an impurity. Moreover, additionally employable as the diode DI are the likes of various kinds of diodes such as a PN junction diode comprising a p type layer and an n type layer, a Schottky diode, and so on, and a punch through diode, and so on. In the present embodiment, the diode DI has a current rectifying characteristic such that current is allowed to flow from the bit line BL to the word line WL.

Operation in Present Embodiment

An operation according to the present embodiment is described with reference to FIGS. 7 through 9. The operation according to the present embodiment is executed simultaneously on a plurality of memory bays MBY. First, the operation in the memory block MBL provided in each of the memory bays MBY is described, then, control of the operation on the plurality of memory bays MBY is described.

Figure 7:
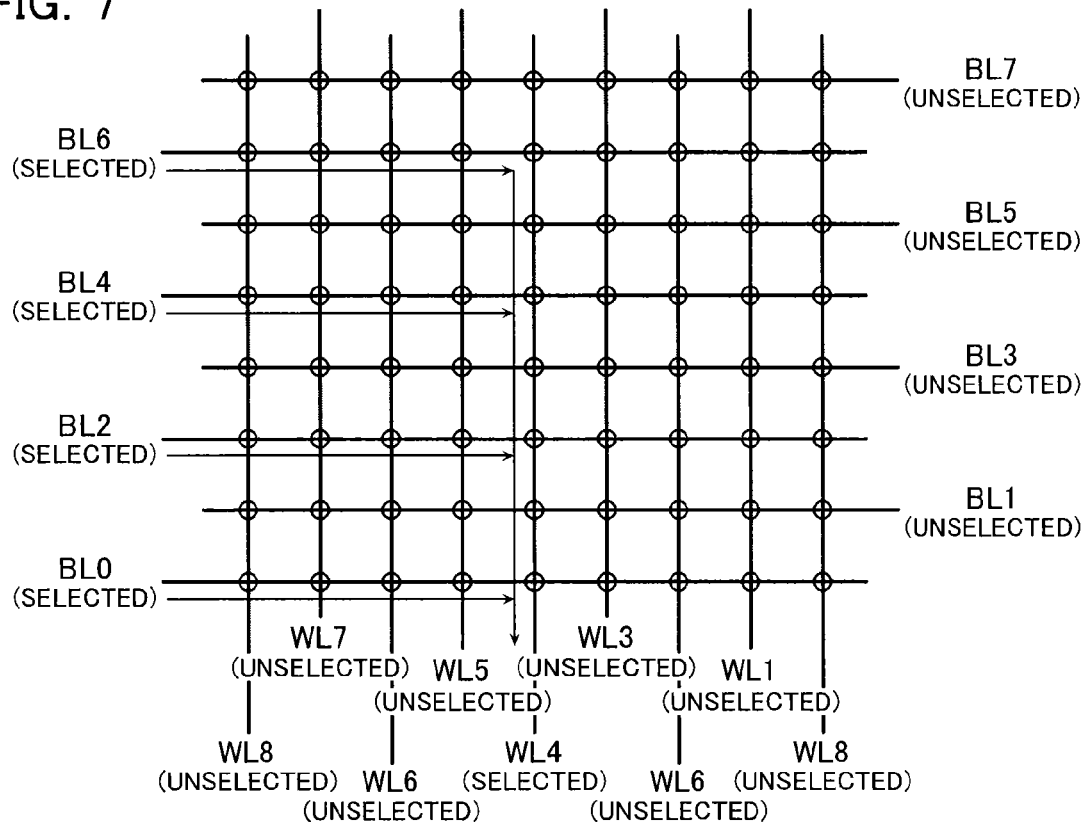
FIG. 7 is a view showing a voltage application state during an operation according to the first embodiment of the present invention.

FIG. 7 is a view showing a voltage application state in one of the memory blocks MBL during the operation in the present embodiment. As shown in FIG. 7, the present embodiment describes an example where, during the operation, selected bit lines BL0, BL2, BL4, and BL6 are selected and the word line WL4 is selected. In the present embodiment, the operation is executed simultaneously on a plurality of the memory cells MC.

Write of data to the memory cell MC is performed by applying a certain voltage VSET to the variable resistor VR of a selected memory cell MC for a certain time. This causes the variable resistor VR of the selected memory cell MC to change from a high-resistance state to a low-resistance state. Below, this operation causing the variable resistor VR to change from a high-resistance state to a low-resistance state is called a setting operation.

Moreover, erase of data in the memory cell MC is performed by applying a certain voltage VRESET to the variable resistor VR of a selected memory cell MC for a certain time. This causes the variable resistor VR of the selected memory cell MC to change from a low-resistance state to a high-resistance state. Below, this operation causing the variable resistor VR to change from a low-resistance state to a high-resistance state is called a resetting operation.

Figure 8:
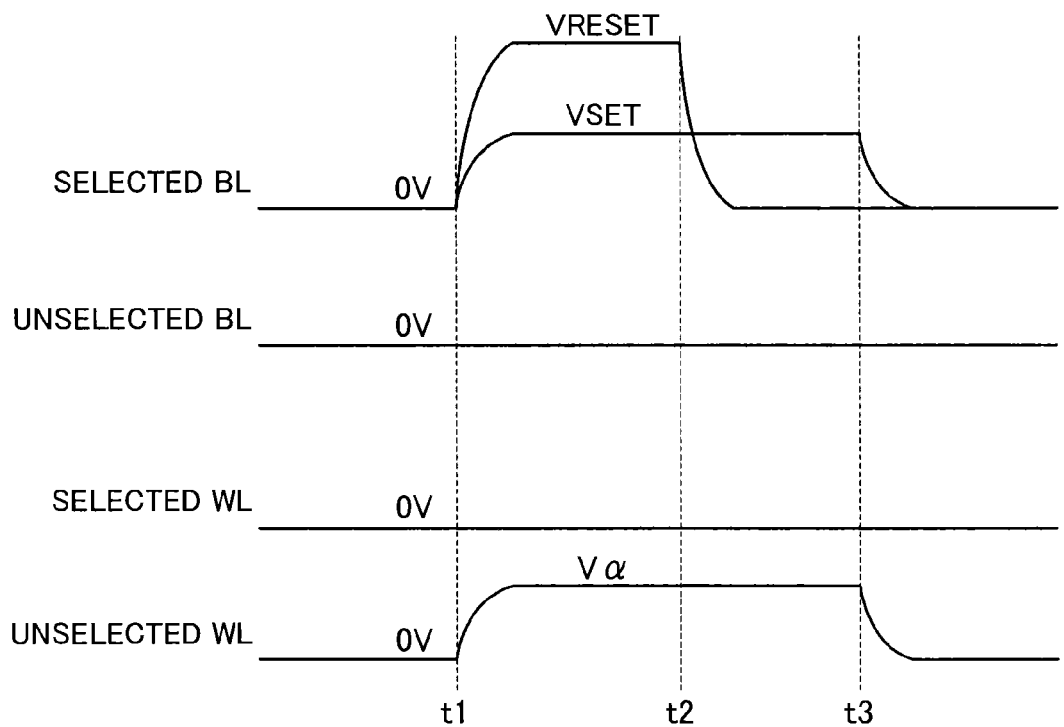
FIG. 8 is a view showing a voltage application state during an operation according to the first embodiment of the present invention.
Figure 9:
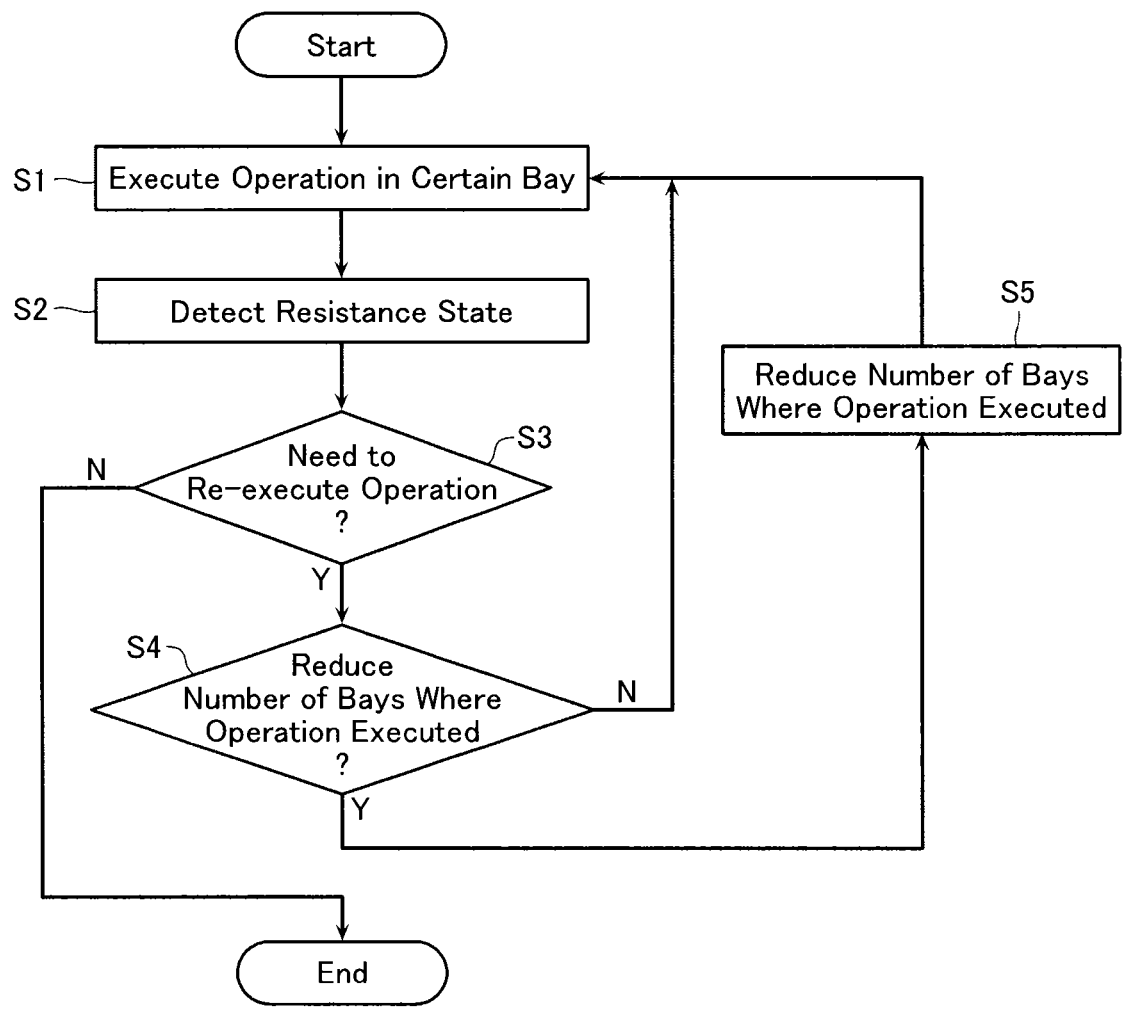
FIG. 9 is a flowchart explaining an operation according to the first embodiment of the present invention.

FIG. 8 is a timing chart of the operation executed on the selected memory cell MC. As shown in FIG. 8, when the operation is started at time t1, the selected bit line BL is applied with the differing voltage VSET or voltage VRESET according to whether the operation is a setting operation or a resetting operation. When the setting operation is executed on a plurality of the memory cells MC, the selected bit lines BL are applied with the voltage VSET. On the other hand, when the resetting operation is executed on a plurality of the memory cells MC, the selected bit lines BL are applied with the voltage VRESET. In addition, the selected word line WL has its voltage maintained at 0 V. This causes the selected memory cell MC provided between the selected bit line BL and the selected word line WL to be applied with the voltage VSET or the voltage VRESET required in the operation. At this time, the unselected bit line BL has its voltage maintained at 0 V, and the unselected word line WL is applied with a voltage Vα. The unselected bit line BL and the unselected word line WL are here set to the voltage 0 V and the voltage Vα, respectively, but may be set to any values that prevent the setting operation or the resetting operation from occurring in the unselected memory cell MC.

In the case of the resetting operation, the voltage VRESET is applied until time t2, and in the case of the setting operation, the voltage VSET is applied until time t3. Then, all of the lines are discharged to complete the operation.

Next, control of the operation on the plurality of memory bays MBY is described. FIG. 9 is a flowchart explaining the operation in the present embodiment. In the present embodiment, the operation is performed simultaneously on a plurality of the memory bays MBY. As shown in FIG. 9, when the operation of the semiconductor memory device is started, the above-described voltage application operation is executed on selected memory cells MC in a plurality of the memory bays MBY (step S1). After this voltage application operation is completed, a resistance state of the variable resistor VR in the selected memory cells MC is detected (step S2).

Next, it is judged whether there is a need to re-execute the voltage application operation on the plurality of memory bays MBY or not, based on the resistance state of the variable resistor VR (step S3). If the variable resistor VR in the selected memory cell MC has not changed to a desired resistance state by the above-described voltage application operation, it is judged necessary to execute the voltage application operation again.

In the case it is judged necessary to execute the voltage application operation again, it is judged whether to change the number of the plurality of memory bays MBY where the voltage application operation is simultaneously executed (step S4). As described later, when it is judged that the number of memory bays MBY where the voltage application operation is simultaneously executed is large, thus leading to characteristics during the voltage application operation on the memory cells deteriorating, the number of memory bays MBY where the voltage application operation is simultaneously executed is reduced (step S5). Thus, in the present embodiment, the number of the selected memory cells MC on which the voltage application operation is simultaneously executed is changed by reducing the number of memory bays MBY where the operation is simultaneously executed. Then, the voltage application operation is performed until the resistance state of the variable resistor VR in all of the selected memory cells MC changes to the desired state, after which the operation finishes.

[Advantages]

Below, advantages of the operation in the present embodiment are described. During the operation in the semiconductor memory device, when the number of memory bays MBY where the voltage application operation is simultaneously executed is large, the number of memory cells MC on which the voltage application operation is simultaneously executed is large. When the operation is executed simultaneously on a large number of memory cells MC in a plurality of memory bays MBY, there is a risk that effects of sneak currents or leak currents in unselected memory cells MC and so on result in it becoming impossible to apply a desired voltage to the selected memory cells MC, whereby the operation in the selected memory cells MC cannot be executed accurately.

In the operation in the present embodiment, when it is judged that characteristics during the voltage application operation on the memory cells MC have deteriorated due to the number of memory bays MBY where the voltage application operation is simultaneously executed being large, the number of memory bays MBY where the operation is simultaneously executed is reduced and the voltage application operation is re-executed. In this repeated voltage application operation, the number of memory bays MBY where the voltage application operation is simultaneously executed is reduced, hence making it possible to execute the operation on the selected memory cells MC accurately. This is because when the number of memory bays MBY simultaneously selected is reduced, the amount of heat generated due to sneak currents is reduced whereby chip temperature can be lowered, resulting in sneak currents in the selected memory bays MBY lowering.

As described above, the semiconductor memory device in the present embodiment changes the number of selected memory cells MC on which the voltage application operation is simultaneously executed by reducing the number of memory bays MBY where the operation is simultaneously executed. As a result, the operation on the selected memory cells MC can be executed reliably.

Second Embodiment

Next, a second embodiment of the present invention is described with reference to FIGS. 10 through 11B. An overall configuration of a semiconductor memory device in the present embodiment is similar to that of the first embodiment, hence a detailed description of the overall configuration is omitted. In addition, places having a similar configuration to those in the first embodiment are assigned with identical reference numerals, and duplicated descriptions of those places are omitted. The above-described first embodiment described an operation where the number of selected memory cells MC on which the voltage application operation is simultaneously executed is changed by reducing the number of memory bays MBY where the operation is simultaneously executed. The second embodiment below describes an operation where, when a plurality of voltage application operations are executed by the control circuit, the number of selected memory cells MC on which the voltage application operation is simultaneously executed in the memory block MBL is changed.

Operation in Present Embodiment

Figure 10:
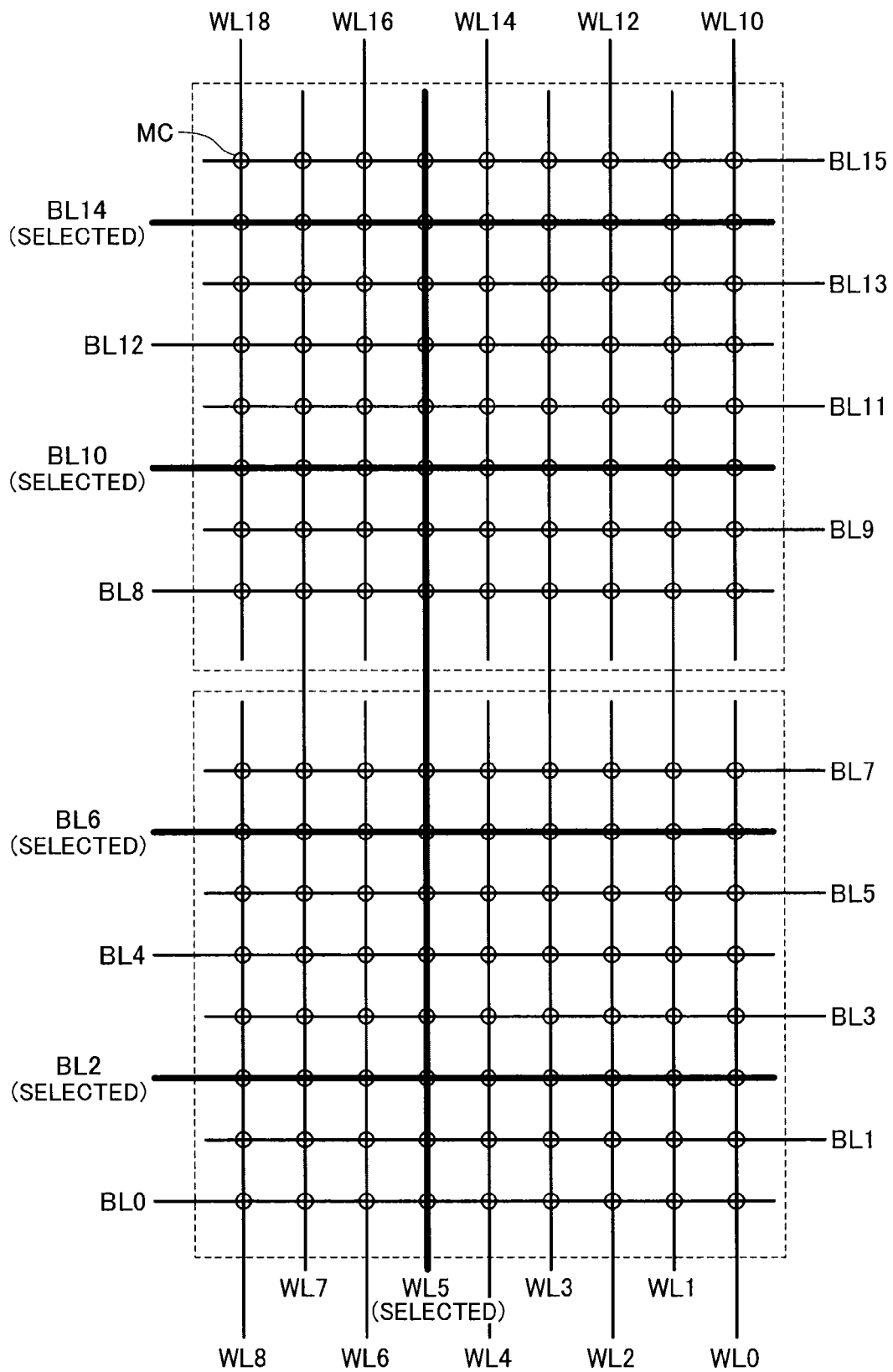
FIG. 10 is a view showing a voltage application state during an operation according to a second embodiment of the present invention.

FIG. 10 is a view showing a voltage application state in two of the memory blocks MBL during the operation in the present embodiment. As shown in FIG. 10, the present embodiment describes an example where, during the operation, selected bit lines BL2, BL6, BL10, and BL14 are selected and the word line WL5 is selected. In the present embodiment too, the operation is executed simultaneously on a plurality of the memory cells MC.

In the present embodiment, when the operation of the semiconductor memory device is started, the voltage application operation is executed on the selected memory cells MC in a plurality of the memory blocks MBL.

In addition, in the case where the resistance state of the variable resistor VR in the selected memory cell MC has not been changed to the desired resistance state by this voltage application operation, it is judged necessary to execute the voltage application operation again. This is similar to the first embodiment. Now, in the present embodiment, the number of selected memory cells MC on which the voltage application operation is simultaneously executed is changed as described using FIGS. 11A and 11B.

Figure 11A:
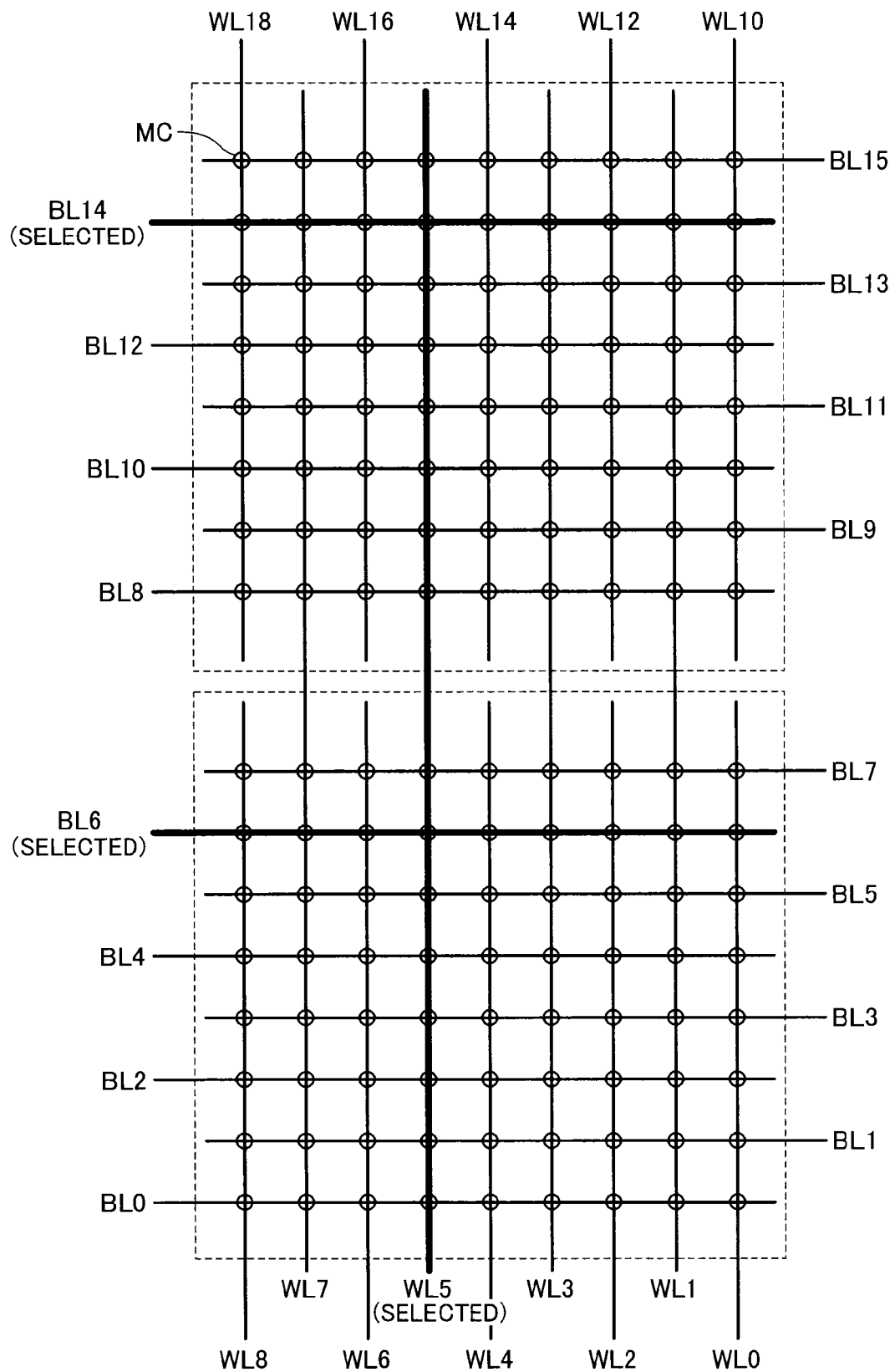
FIG. 11A is a view showing a voltage application state during an operation according to the second embodiment of the present invention.
Figure 11B:
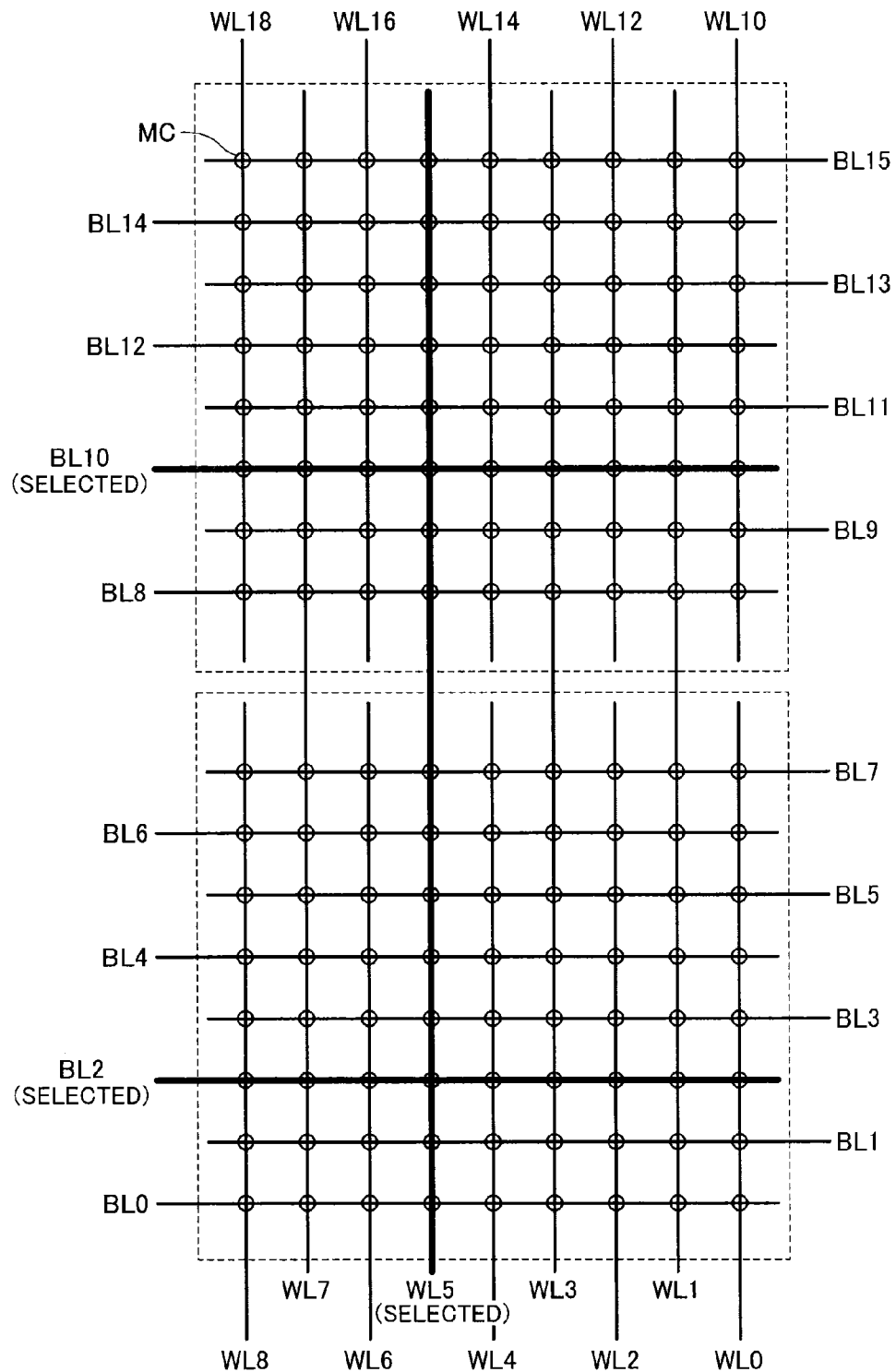
FIG. 11B is a view showing a voltage application state during an operation according to the second embodiment of the present invention.

FIGS. 11A and 11B are views showing a voltage application state in two of the memory blocks MBL during the operation in the present embodiment. First, as shown in FIG. 11A, in the case that the voltage application operation is performed again after the operation is executed on the selected memory cells MC as shown in FIG. 10, the bit lines BL6 and BL14 are selected and the word line WL5 is selected to perform the voltage application operation. Next, as shown in FIG. 11B, the bit lines BL2 and BL10 are selected and the word line WL5 is selected to perform the voltage application operation.

In this way, in the voltage application operation of the present embodiment, one portion of the selected memory cells MC on which the voltage application operation was initially executed is subject to a repeated voltage application operation, and another portion thereof is subject to a repeated voltage application operation separately. Furthermore, as shown in FIG. 11A, the one portion of the selected memory cells MC on which the voltage application operation is first executed is set to be dispersed in two different memory blocks MBL, and as shown in FIG. 11B, the other portion of the selected memory cells MC on which the voltage application operation is later executed is set to be dispersed in two different memory blocks MBL. As a result, during a repeated voltage application operation on a plurality of memory blocks MBL, the number of selected memory cells MC on which the operation is simultaneously executed is changed. Then, the voltage application operation is performed until the resistance state of the variable resistor VR in all of the selected memory cells MC changes to the desired state, after which the operation finishes.

[Advantages]

In the operation in the present embodiment, when the resistance state of the memory cell MC in a certain voltage application operation has not changed and it is judged necessary to re-execute the voltage application operation, the number of memory cells MC on which the operation is simultaneously executed in one of the memory blocks MBL is reduced and the voltage application operation re-executed. In this repeated voltage application operation, the number of memory cells MC on which the voltage application operation is simultaneously executed is reduced, hence making it possible to execute the operation on the selected memory cells MC reliably.

Other Example

The above embodiments have been described as embodiments where, in the case that the voltage application operation is performed again after the operation has been executed on the selected memory cells MC, the repeated voltage application operation is performed on all of the selected memory cells MC (refer to FIGS. 11A and 11B). Now, the plurality of selected memory cells MC may include a memory cell whose resistance state changes by the initial voltage application operation and for which a repeated voltage application operation is therefore not required.

Memory cells MC where the variable resistor VR has changed to the desired resistance state can be detected by detecting the resistance state of the variable resistor VR in the selected memory cells MC in every voltage application operation. In the case there is a selected memory cell MC whose variable resistor VR has changed to the desired resistance state by a certain voltage application operation, the number of selected memory cells MC on which the voltage application operation is simultaneously executed is changed as described below using FIGS. 12A and 12B.

Figure 12A:
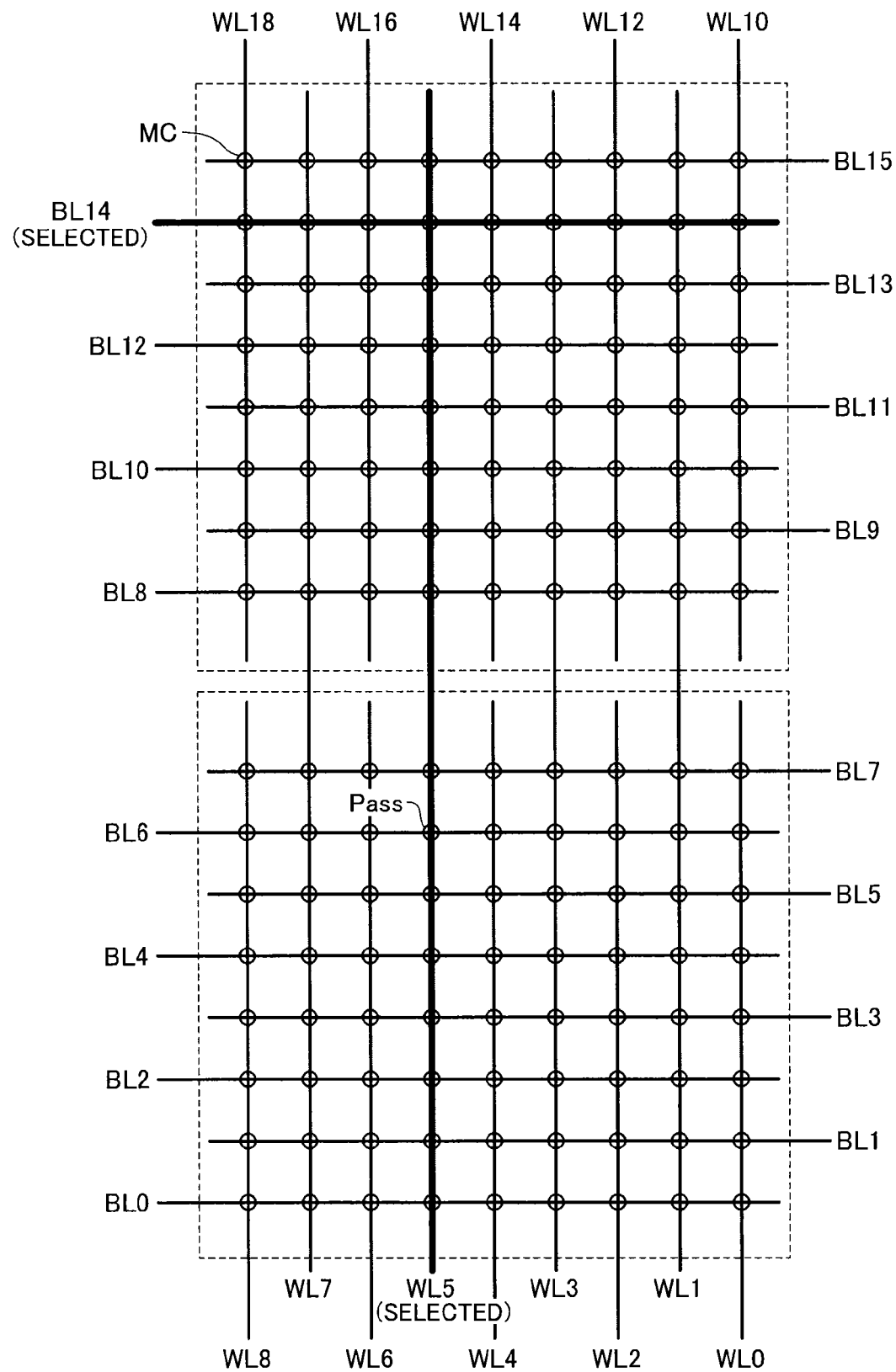
FIG. 12A is a view showing a voltage application state during an operation according to the second embodiment of the present invention.
Figure 12B:
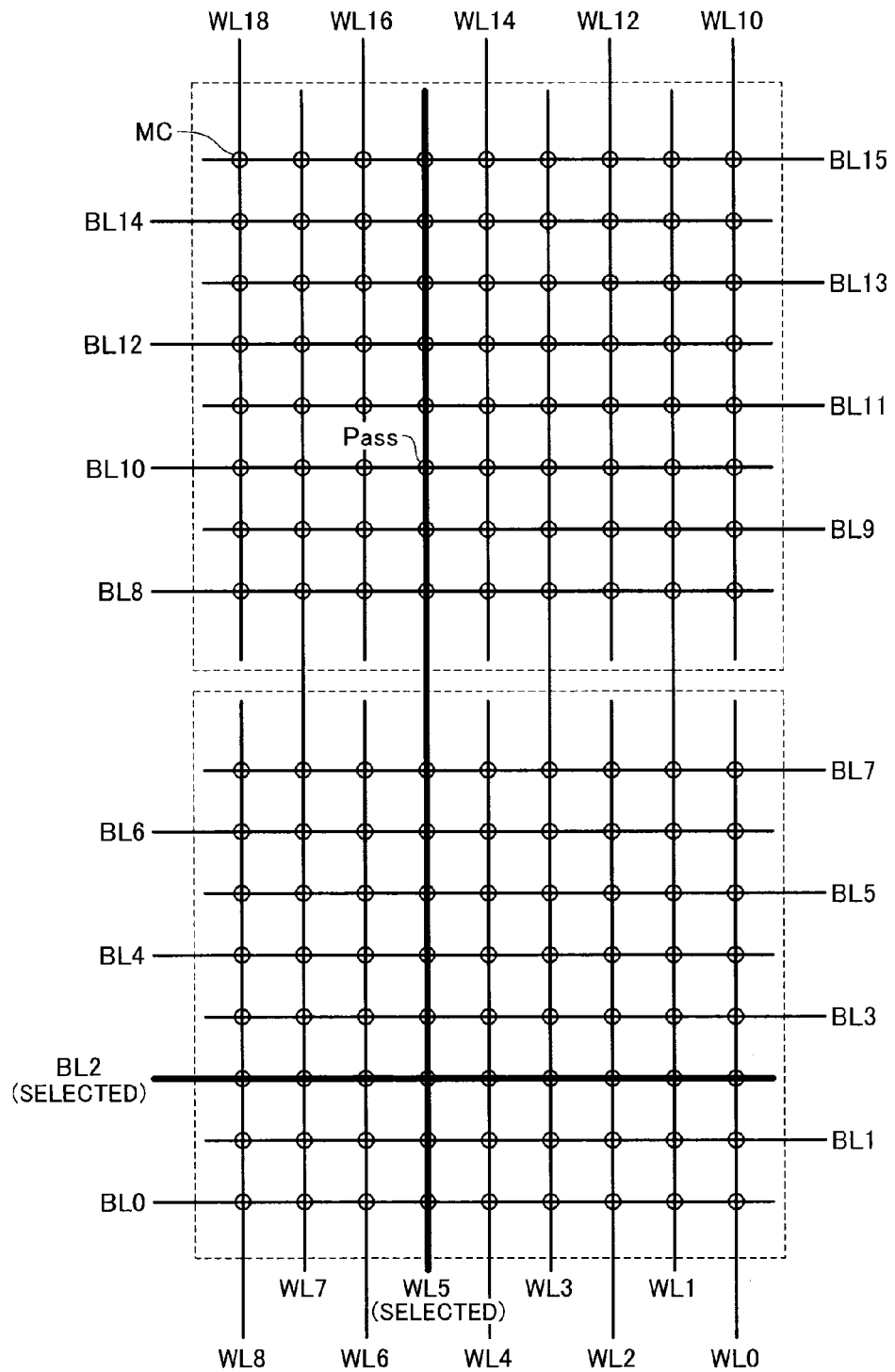
FIG. 12B is a view showing a voltage application state during an operation according to the second embodiment of the present invention.

FIGS. 12A and 12B are views showing a voltage application state in two of the memory blocks MBL during the operation in the present embodiment. At this time, the memory cells MC connected to the bit lines BL6 and BL10 and the word line WL5 have changed to the desired resistance state after having undergone the operation on the selected memory cells MC as shown in FIG. 10, hence there is no longer a need to re-execute the voltage application operation on these memory cells MC connected to the bit lines BL6 and BL10 and the word line WL5 (state: Pass). In the case that the voltage application operation is performed again under these circumstances, first, as shown in FIG. 12A, the bit line BL14 only is selected and the word line WL5 is selected to perform the voltage application operation. Next, as shown in FIG. 12B, the bit line BL2 only is selected and the word line WL5 is selected to perform the voltage application operation.

In this way, the selected memory cells MC whose resistance state of the variable resistor VR has been changed by an initial voltage application is excluded from the subject of the subsequent voltage application operation. Further employing this feature may enhance the advantages of decreasing the number of memory cells MC on which the voltage application operation is simultaneously executed, hence making it possible to execute the operation on the selected memory cells MC reliably.

Third Embodiment

Next, a third embodiment of the present invention is described with reference to FIGS. 13 through 16B. An overall configuration of a semiconductor memory device in the present embodiment is similar to that of the first embodiment, hence a detailed description of the overall configuration is omitted. In addition, places having a similar configuration to those in the first embodiment are assigned with identical reference numerals, and duplicated descriptions of those places are omitted. The above-described first and second embodiments described the case where the memory cell array 1 has one layer only. The third embodiment below describes the operation in the case where the memory cell array 1 is a stacked array.

[Example of Stacked Memory Cell Array]

Figure 13:
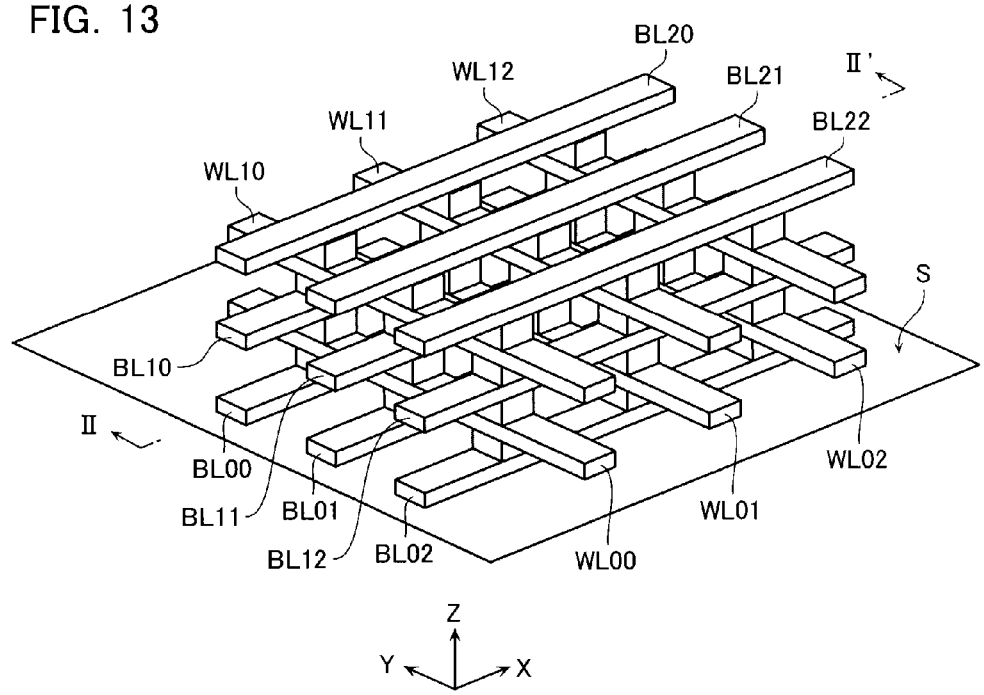
FIG. 13 is a perspective view of part of a memory cell array 1 in a separate configuration example.
Figure 14:
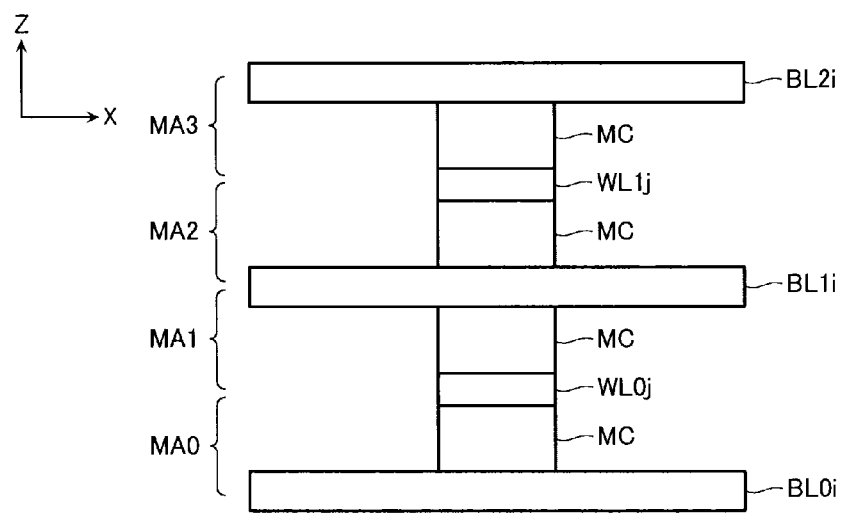
FIG. 14 is a cross-sectional view taken along the line II-II' as seen in the direction of the arrows in FIG. 13.

As shown in FIG. 13, the memory cell structure in the aforementioned embodiments may be multiply stacked in the Z direction to configure a three-dimensional structure. FIG. 14 is a cross-sectional view showing a cross-section taken along the line II-II' in FIG. 13. The example illustrated is a memory cell array having a four layer structure configured from cell array layers MA0~MA3. The word line WL0j is shared by the memory cells MC in the cell array layers MA0 and MA1 below and above the word line WL0j, the bit line BL1i is shared by the memory cells MC in the cell array layers MA1 and MA2 below and above the bit line BL1i, and the word line WL1j is shared by the memory cells MC in the cell array layers MA2 and MA3 below and above the word line WL1j. Note that the aforementioned column control circuit 2 and row control circuit 3 may be provided to each of the cell array layers MA, or may be shared by the cell array layers MA.

Operation in Present Embodiment

Figure 15:
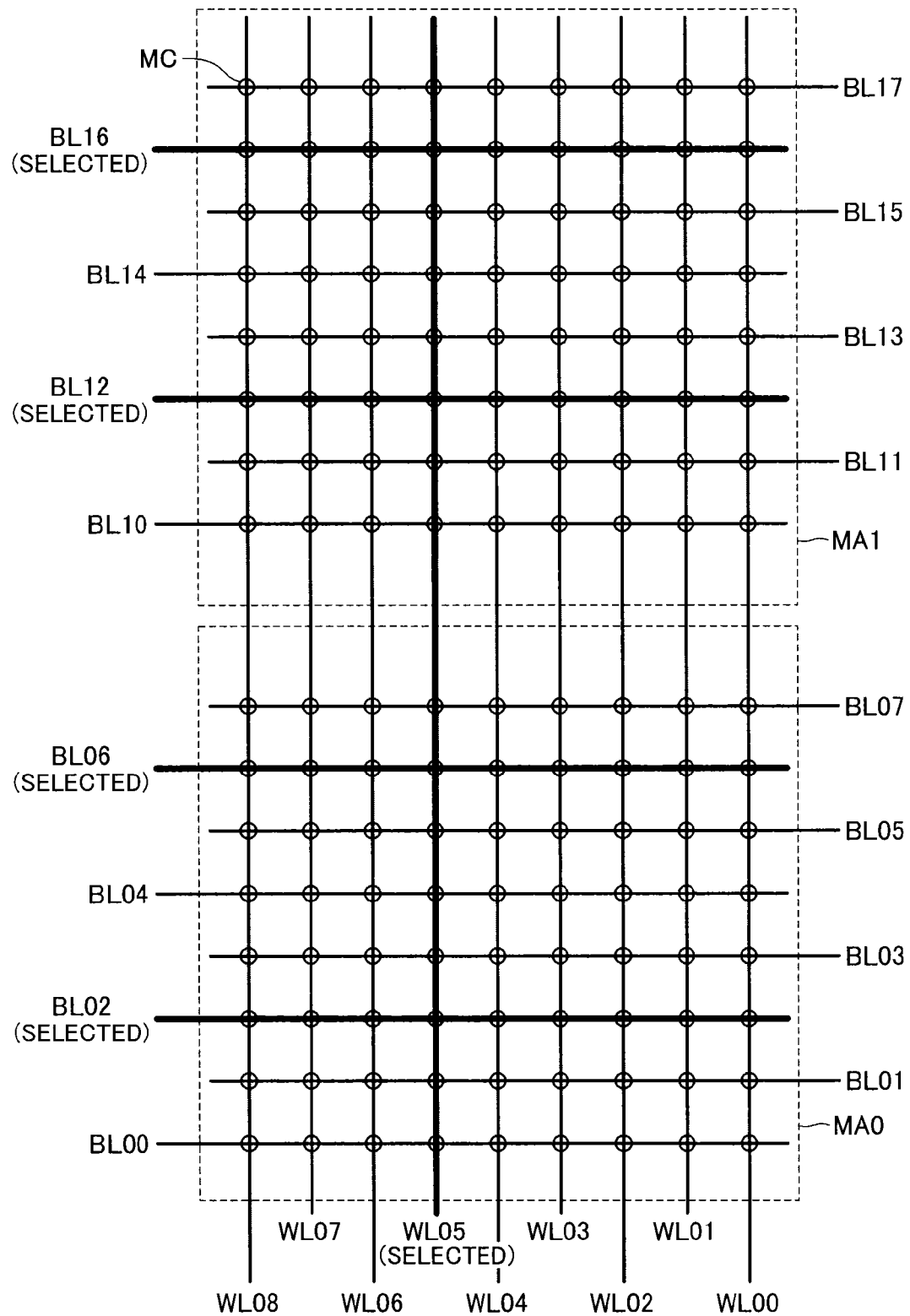
FIG. 15 is a view showing a voltage application state during an operation according to a third embodiment of the present invention.

FIG. 15 is a view showing a voltage application state in two of the cell array layers MA during the operation in the present embodiment. FIG. 15 shows an example where the voltage application operation is executed on a plurality of selected memory cells MC in the two cell array layers MA0 and MA1 sharing word lines WL. As shown in FIG. 15, the present embodiment describes an example where, during the operation, selected bit lines BL02, BL06, BL12, and BL16 are selected and the word line WL05 is selected. In the present embodiment too, the operation is executed simultaneously on a plurality of the memory cells MC.

In the present embodiment, when the operation of the semiconductor memory device is started, the voltage application operation is executed on the selected memory cells MC in a plurality of the cell array layers MA. In addition, in the case where the resistance state of the variable resistor VR in the selected memory cell MC has not been changed to the desired resistance state by this voltage application operation, it is judged necessary to execute the voltage application operation again. This is similar to the first embodiment. Now, in the present embodiment, the number of selected memory cells MC on which the voltage application operation is simultaneously executed is changed as described using FIGS. 16A and 16B.

Figure 16A:
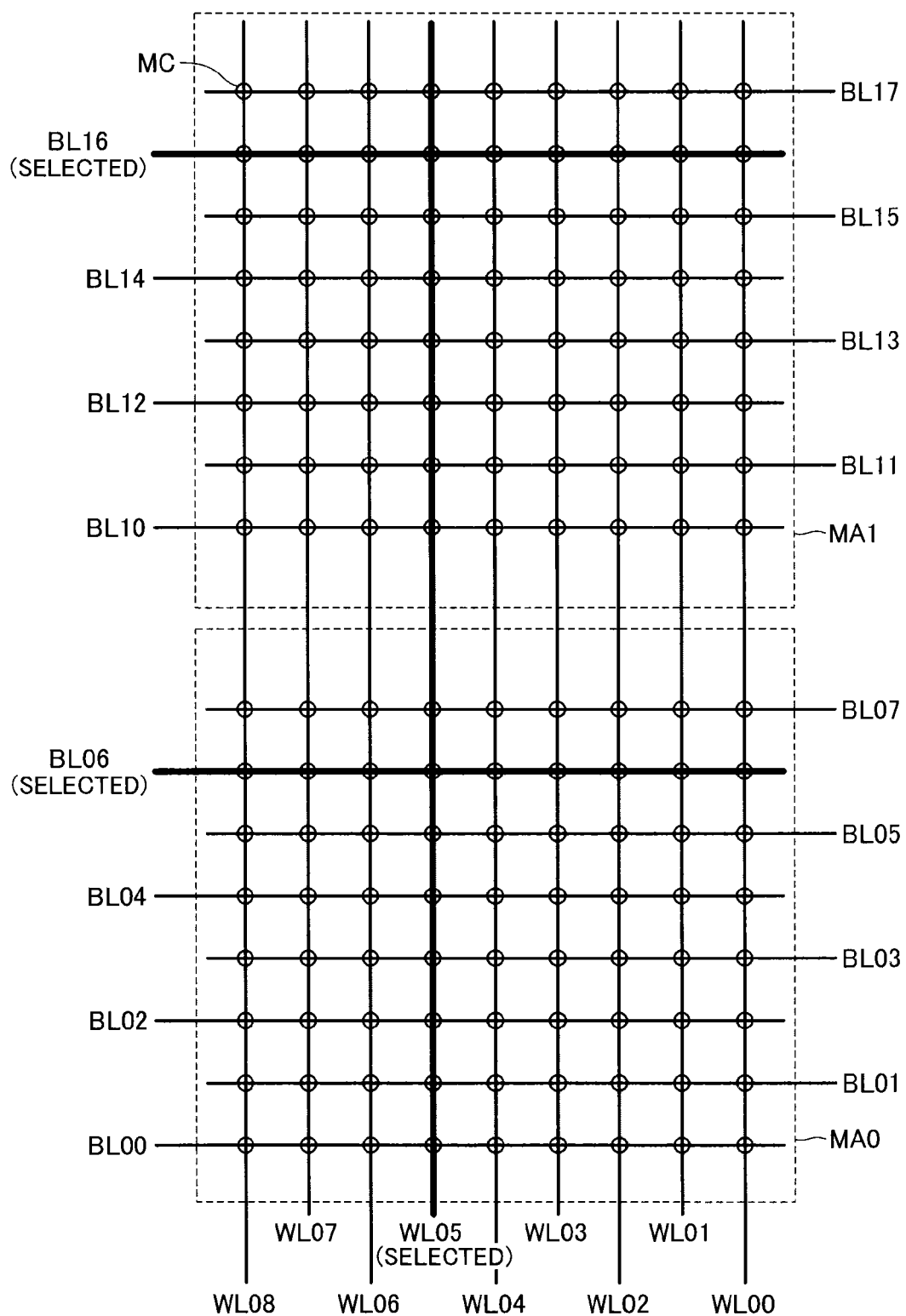
FIG. 16A is a view showing a voltage application state during an operation according to the third embodiment of the present invention.
Figure 16B:
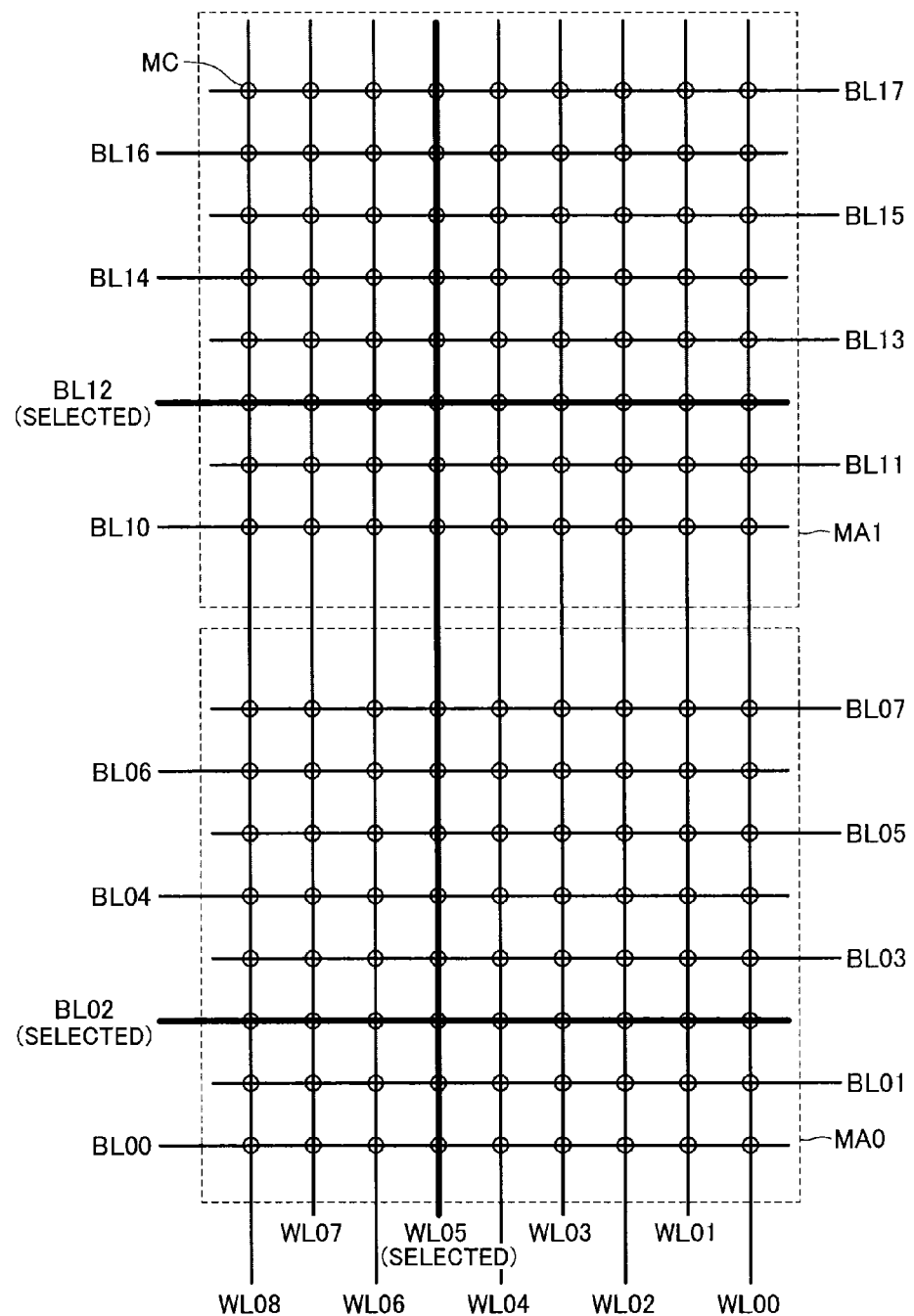
FIG. 16B is a view showing a voltage application state during an operation according to the third embodiment of the present invention.

FIGS. 16A and 16B are views showing a voltage application state in two of the cell array layers MA0 and MA1 during the operation in the present embodiment. First, as shown in FIG. 16A, in the case that the voltage application operation is performed again after the operation is executed on the selected memory cells MC as shown in FIG. 15, the bit lines BL02 and BL12 are selected and the word line WL05 is selected to perform the voltage application operation. Next, as shown in FIG. 16B, the bit lines BL06 and BL16 are selected and the word line WL05 is selected to perform the voltage application operation.

In this way, in the voltage application operation of the present embodiment, one portion of the selected memory cells MC on which the voltage application operation was initially executed is subject to a repeated voltage application operation, and another portion thereof is subject to a repeated voltage application operation separately. Furthermore, as shown in FIG. 16A, the one portion of the selected memory cells MC on which the voltage application operation is first executed is set to be dispersed in two different cell array layers MA0 and MA1, and as shown in FIG. 16B, the other portion of the selected memory cells MC on which the voltage application operation is later executed is set to be dispersed in two different cell array layers MA0 and MA1. As a result, during a repeated voltage application operation on a plurality of cell array layers MA0 and MA1, the number of selected memory cells MC on which the operation is simultaneously executed is changed. Then, the voltage application operation is performed until the resistance state of the variable resistor VR in all of the selected memory cells MC changes to the desired state, after which the operation finishes.

[Advantages]

In the operation of the present embodiment, when the resistance state of the memory cell MC in a certain voltage application operation has not changed and it is judged necessary to re-execute the voltage application operation, the number of memory cells MC on which the operation is simultaneously executed in one of the cell array layers MA is reduced and the voltage application operation re-executed. In this repeated voltage application operation, the number of memory cells MC on which the voltage application operation is simultaneously executed is reduced, hence making it possible to execute the operation on the selected memory cells MC reliably.

Note that in the present embodiment too, similarly to in the other example of the second embodiment, the selected memory cells MC in which the resistance state of the variable resistor VR has been caused to change by the initial voltage application operation can be excluded from a later voltage application operation. As a result, the number of memory cells MC on which the voltage application operation is simultaneously executed can be reduced, hence making it possible to execute the operation on the selected memory cells MC reliably.

While certain embodiments of the inventions have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, each of the aforementioned embodiments may be carried out in various combinations with each other. It is possible to execute a combination of the first embodiment that changes the number of memory bays MBY where the voltage application operation is simultaneously executed and the second embodiment that changes the number of selected memory cells on which the voltage application operation is simultaneously executed in the memory block MBL. Alternatively, in order to compensate for a voltage drop in the lines, the column control circuit 2 and the row control circuit 3 may be set to apply a voltage which is supplemented by a voltage drop portion that accords with an address of the bit line BL.

In case the memory bay MBY is formed of multiple memory blocks MBL, bit lines BL may be formed to have a hierarchic structure of local bit lines LBL disposed in the respective memory blocks MBL and global bit lines GBL disposed in common to the multiple memory blocks MBL.

Figure 17:
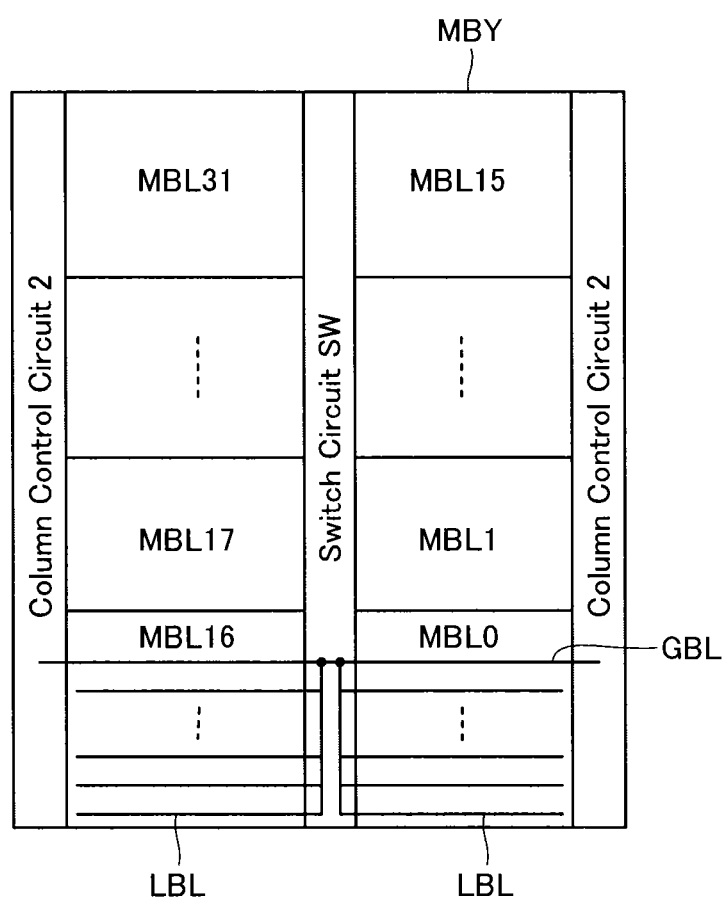
FIG. 17 is a block diagram of the semiconductor memory device according to one example of the present invention.

As shown in FIG. 17, the memory bay MBY includes a global bit line GBL, a switch circuit SW, local bit lines LBL, and memory blocks MBL. As shown in FIG. 17, the global bit line GBL is connected to the column control circuit 2. The global bit line GBL is also connected to the switch circuit SW and the switch circuit SW is connected to the local bit lines LBL. The switch circuit SW controls electrical connection between the global bit line GBL and the local bit lines LBL based on an address signal. Each of the memory blocks MBL is operated by a respective local bit lines LBL.

In addition, memory block MBL may be configured to have three dimensional form, using the variable resistor VR having current rectifying function.

Figure 18:
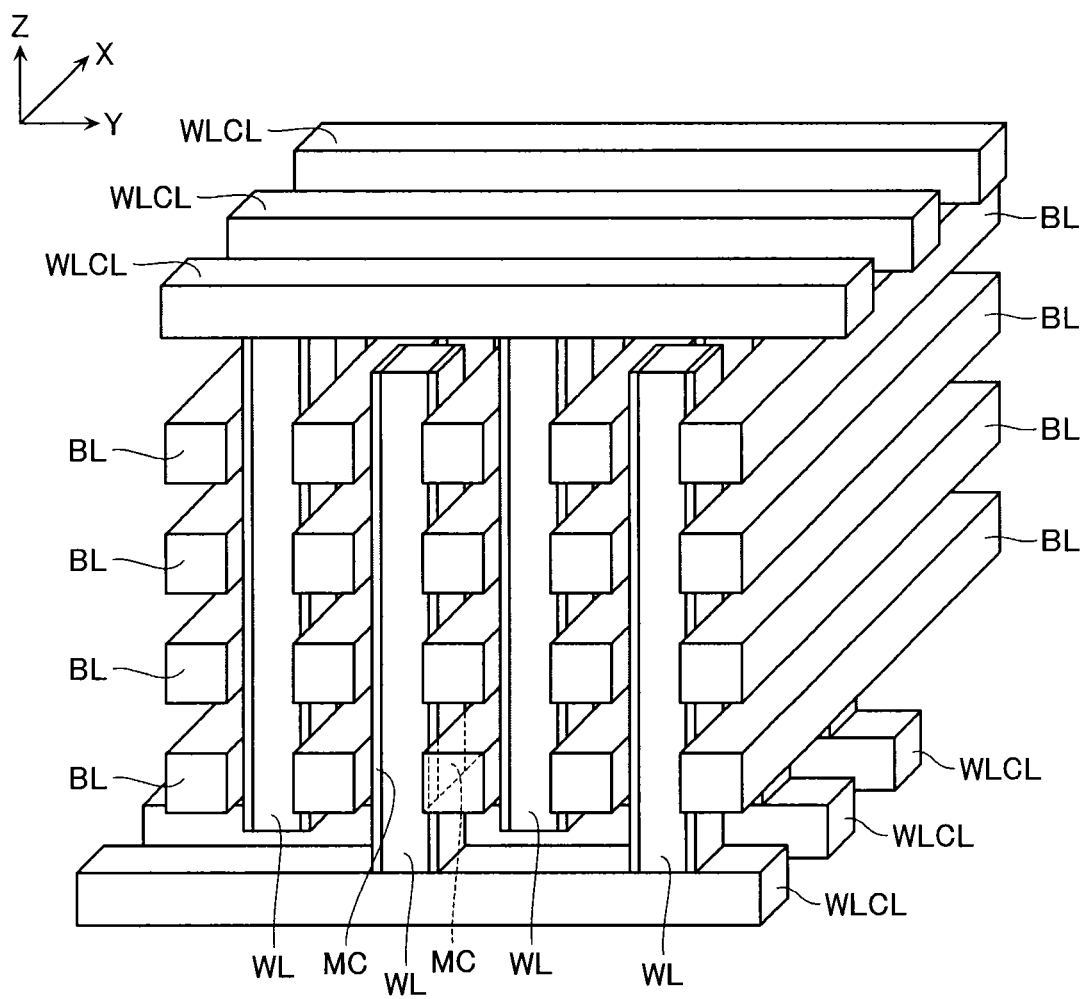
FIG. 18 is a perspective view showing part of the memory block MBL of another example of the present invention.

FIG. 18 is a perspective view showing part of the memory block MBL.

The memory block MBL includes a plurality of bit lines BL arranged in a Z-X plane to extend in the X direction and having a certain pitch in the Z direction, a plurality of column-shaped word lines WL arranged in the Z-X plane to extend in the Z direction and having a certain pitch in the X direction, and memory cells MC provided at each of intersections of these bit lines BL and word lines WL. Note that the word lines WL and bit lines BL are shared by two memory cells MC adjacent in the Y direction. In addition, word lines WL are commonly connected by word line connecting lines WLCL arranged in an X-Y plane to extend in the Y direction and having a certain pitch in the X direction.

Configuring the memory block MBL in the three dimensional form allows optimization of the chip area.

What is claimed is:

1. A semiconductor memory device, comprising:
a plurality of first lines disposed on a substrate;
a plurality of second lines disposed intersecting the first lines;
a memory cell array including memory cells, each of the memory cells disposed at each of intersections of the first lines and the second lines and including a variable resistor; and
a control circuit configured to apply a first voltage to a selected first line and to apply a second voltage having a voltage value which is smaller than that of the first voltage to a selected second line, such that a selected memory cell disposed at the intersection of the selected first line and the selected second line is applied with a first potential difference required in an operation of the selected memory cell,
the control circuit being configured such that when the first potential difference is applied a plurality of times to a plurality of the selected memory cells to execute the operation and in a case there are a plurality of the selected memory cells of which resistance state of their respective variable resistors is not changed after a certain application of the voltage to the selected memory cells, the selected memory cells to which the first potential difference was applied simultaneously in the certain application of the voltage are divided into a plurality of groups to which the first potential difference can be applied simultaneously next after the certain application of the voltage.

2. The semiconductor memory device according to claim 1, wherein
each of the divided group includes at least one selected memory cell of which resistance state of the variable resistor is not changed.

3. The semiconductor memory device according to claim 1, wherein
the memory cell array is divided into a plurality of memory bays, and
the control circuit changes the number of selected memory cells simultaneously applied with the first potential difference by reducing the number of memory bays where the operation is simultaneously executed.

4. The semiconductor memory device according to claim 3, wherein
each of the memory bays is divided into a plurality of memory blocks, and
the control circuit applies the first voltage and the second voltage to a plurality of the first lines and one of the second lines, respectively, whereby a plurality of the selected memory cells in one of the memory blocks are applied with the first potential difference.

5. The semiconductor memory device according to claim 1, wherein
the control circuit, when a plurality of the selected memory cells are applied with the first potential difference, applies a third voltage to an unselected first line which is a first line excluding the selected first line, and applies a fourth voltage to an unselected second line which is a second line excluding the selected second line, and
the third voltage and the fourth voltage are set such that an unselected memory cell is applied with a potential difference which is smaller than the first potential difference.

6. The semiconductor memory device according to claim 1, wherein
the variable resistor changes from a low-resistance state to a high-resistance state due to the first potential difference.

7. A semiconductor memory device, comprising:
a plurality of first lines disposed on a substrate;
a plurality of second lines disposed intersecting the first lines;
a memory cell array including memory cells, each of the memory cells disposed at each of intersections of the first lines and the second lines and including a variable resistor; and
a control circuit configured to apply a first voltage to a selected first line and to apply a second voltage having a voltage value which is smaller than that of the first voltage to a selected second line, such that a selected memory cell disposed at the intersection of the selected first line and the selected second line is applied with a first potential difference required in an operation of the selected memory cell,
the control circuit being configured to, when the first potential difference is applied a plurality of times to a plurality of the selected memory cells to execute the operation and in a case there are a plurality of the selected memory cells of which resistance state of their respective variable resistors is not changed after a certain application of the voltage to the selected memory cells, divide the memory cells to which the first potential difference was applied simultaneously in the certain application of the voltage into a plurality of groups to which the first potential difference can be applied simultaneously next after the certain application of the voltage, execute a first voltage application operation in which a certain number of the divided groups are applied with the first potential difference and execute a second voltage application operation in which one portion and another portion of the divided groups that have undergone the first voltage application operation are separately applied with the first potential difference.

8. The semiconductor memory device according to claim 7, wherein
each of the divided group includes at least one selected memory cell of which resistance state of the variable resistor is not changed.

9. The semiconductor memory device according to claim 7, wherein
the memory cell array is divided into a plurality of memory blocks, and
the control circuit executes the second voltage application operation such that the one portion of the divided groups is dispersed in separate memory blocks and the other portion of the divided groups is dispersed in separate memory blocks.

10. The semiconductor memory device according to claim 7, wherein
the control circuit excludes from the second voltage application operation the selected memory cells in which a resistance state of the variable resistor has changed to a desired state by the first voltage application operation.

11. The semiconductor memory device according to claim 7, wherein
the memory cell array is divided into a plurality of memory blocks, and
the control circuit applies the first voltage and the second voltage to a plurality of the first lines and one of the second lines, respectively, whereby a plurality of the selected memory cells in one of the memory blocks are applied with the first potential difference.

12. The semiconductor memory device according to claim 7, wherein
the control circuit, when a plurality of the selected memory cells are applied with the first potential difference, applies a third voltage to an unselected first line which is a first line excluding the selected first line, and applies a fourth voltage to an unselected second line which is a second line excluding the selected second line, and
the third voltage and the fourth voltage are set such that an unselected memory cell is applied with a potential difference which is smaller than the first potential difference.

13. The semiconductor memory device according to claim 7, wherein
the variable resistor changes from a low-resistance state to a high-resistance state due to the first potential difference.

14. A semiconductor memory device, comprising:
a plurality of first lines disposed on a substrate;
a plurality of second lines disposed intersecting the first lines;
a memory cell array including memory cells, each of the memory cells disposed at each of intersections of the first lines and the second lines and including a variable resistor; and
a control circuit configured to apply a first voltage to a selected first line and to apply a second voltage having a voltage value which is smaller than that of the first voltage to a selected second line, such that a selected memory cell disposed at the intersection of the selected first line and the selected second line is applied with a first potential difference required in an operation of the selected memory cell,
the memory cell array being an array in which pluralities of the first lines, the second lines, and the memory cells are stacked in a perpendicular direction on the substrate, and
the control circuit being configured to, when the first potential difference is applied a plurality of times to a plurality of the selected memory cells to execute the operation and in a case there are a plurality of the selected memory cells of which resistance state of their respective variable resistors is not changed after a certain application of the voltage to the selected memory cells, divide the memory cells to which the first potential difference was applied simultaneously in the certain application of the voltage into a plurality of groups to which the first potential difference can be applied simultaneously next after the certain application of the voltage, execute a first voltage application operation in which a certain number of the divided groups are applied with the first potential difference, and execute a second voltage application operation in which one portion and another portion of the divided groups that have undergone the first voltage application operation are separately applied with the first potential difference.

15. The semiconductor memory device according to claim 14, wherein
each of the divided group includes at least one selected memory cell of which resistance state of the variable resistor is not changed.

16. The semiconductor memory device according to claim 14, wherein
the control circuit executes the second voltage application operation such that the one portion of the divided groups is dispersed in separate layers in the memory cell array and the other portion of the divided groups is dispersed in separate layers in the memory cell array.

17. The semiconductor memory device according to claim 14, wherein
the control circuit excludes from the second voltage application operation the selected memory cells in which a resistance state of the variable resistor has changed to a desired state by the first voltage application operation.

18. The semiconductor memory device according to claim 14, wherein
the control circuit applies the first voltage and the second voltage to a plurality of the first lines and one of the second lines, respectively, whereby a plurality of the selected memory cells in one of layers in the memory cell array are applied with the first potential difference.

19. The semiconductor memory device according to claim 14, wherein
the control circuit, when a plurality of the selected memory cells are applied with the first potential difference, applies a third voltage to an unselected first line which is a first line excluding the selected first line, and applies a fourth voltage to an unselected second line which is a second line excluding the selected second line, and
the third voltage and the fourth voltage are set such that an unselected memory cell is applied with a potential difference which is smaller than the first potential difference.

20. The semiconductor memory device according to claim 14, wherein
the variable resistor changes from a low-resistance state to a high-resistance state due to the first potential difference.

* * * * *